United States Patent
Gril-Maffre et al.

(10) Patent No.: US 11,189,360 B2
(45) Date of Patent: Nov. 30, 2021

(54) METHOD FOR MANAGING THE MEMORY SPACE OF A MEMORY DEVICE AND CORRESPONDING SYSTEM

(71) Applicant: STMicroelectronics (Rousset) SAS, Rousset (FR)

(72) Inventors: Jean-Michel Gril-Maffre, Aix-en-Provence (FR); Christophe Eva, Rousset (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 69 days.

(21) Appl. No.: 16/669,184

(22) Filed: Oct. 30, 2019

(65) Prior Publication Data

US 2020/0174927 A1    Jun. 4, 2020

(30) Foreign Application Priority Data

Dec. 3, 2018 (FR) .................................. 1872239

(51) Int. Cl.
*G11C 29/00* (2006.01)
*G06F 11/10* (2006.01)
*G06F 12/06* (2006.01)

(52) U.S. Cl.
CPC .......... *G11C 29/76* (2013.01); *G06F 11/1076* (2013.01); *G06F 12/0646* (2013.01); *G06F 2212/1032* (2013.01)

(58) Field of Classification Search
CPC .. G06F 12/0646; G06F 11/1076; G11C 29/76
See application file for complete search history.

(56) References Cited

U.S. PATENT DOCUMENTS

| | | | | |
|---|---|---|---|---|
| 5,862,154 | A * | 1/1999 | Pawlowski | G06F 12/0879 714/763 |
| 7,212,456 | B2 * | 5/2007 | Callaway | G11C 29/006 365/189.07 |
| 9,460,816 | B2 * | 10/2016 | Youn | G06F 11/1048 |
| 10,275,306 | B1 * | 4/2019 | MacLaren | G06F 11/1048 |
| 10,929,033 | B2 * | 2/2021 | Meeker | G06F 3/0685 |
| 2006/0059298 | A1 | 3/2006 | Cho et al. | |
| 2010/0211820 | A1 * | 8/2010 | Kim | G06F 12/0246 714/5.1 |
| 2010/0313100 | A1 * | 12/2010 | Hicken | G06F 11/1068 714/773 |
| 2013/0039129 | A1 * | 2/2013 | Radke | G11C 29/52 365/185.09 |
| 2019/0050345 | A1 * | 2/2019 | Satoyama | G06F 12/00 |

FOREIGN PATENT DOCUMENTS

KR    101512927 B1    4/2015

* cited by examiner

*Primary Examiner* — Steve N Nguyen
(74) *Attorney, Agent, or Firm* — Slater Matsil, LLP

(57) ABSTRACT

A system includes a memory device that includes a first memory region to store first data at first addresses, and a second memory region to store, on command, either second data at second addresses or error correction code check bits associated with the first data at third addresses.

22 Claims, 7 Drawing Sheets

[Fig. 1]
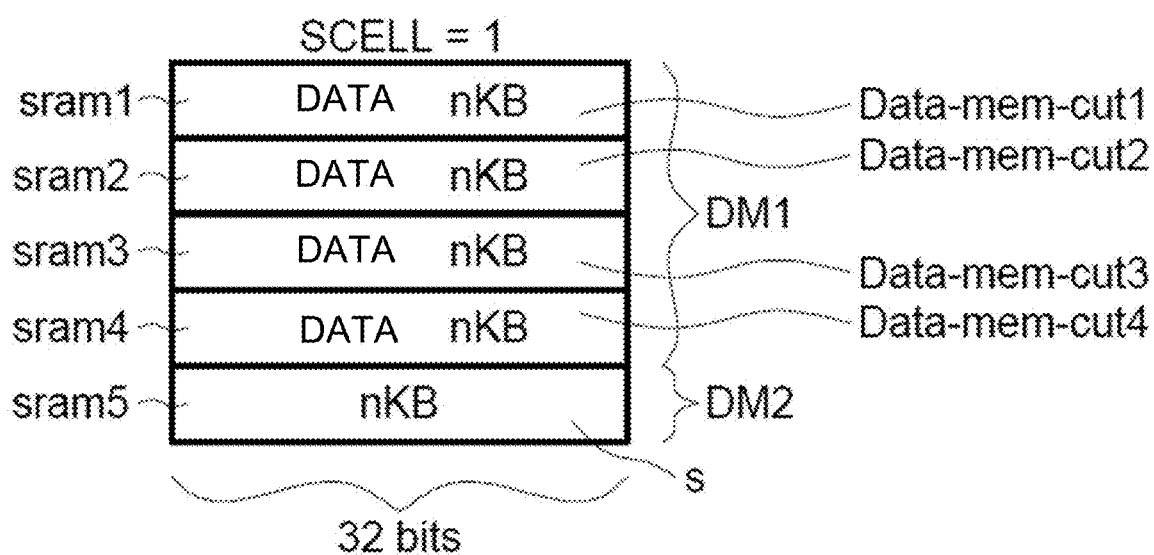

[Fig. 2]
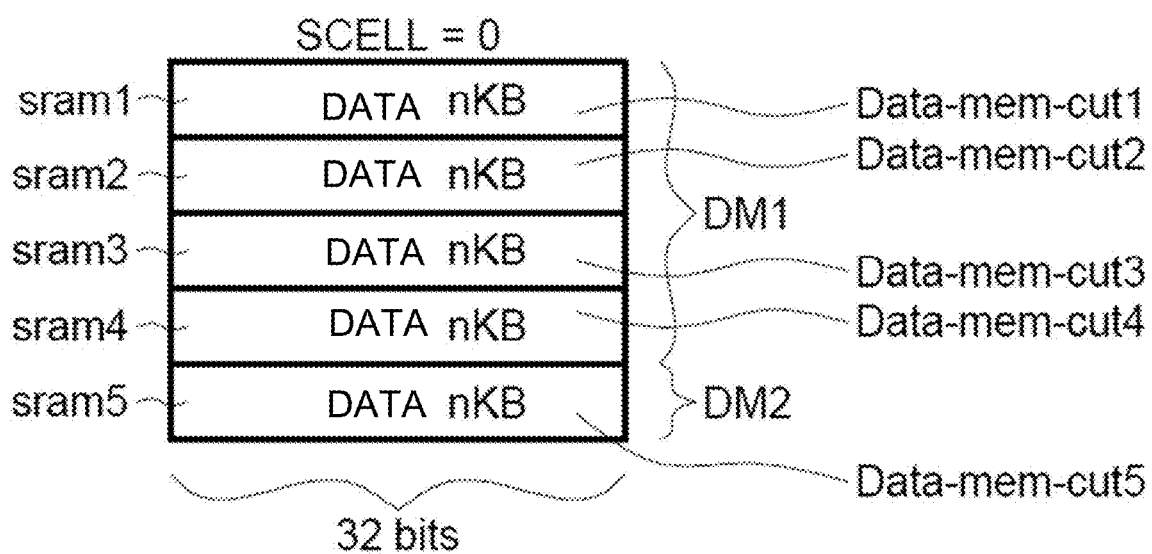

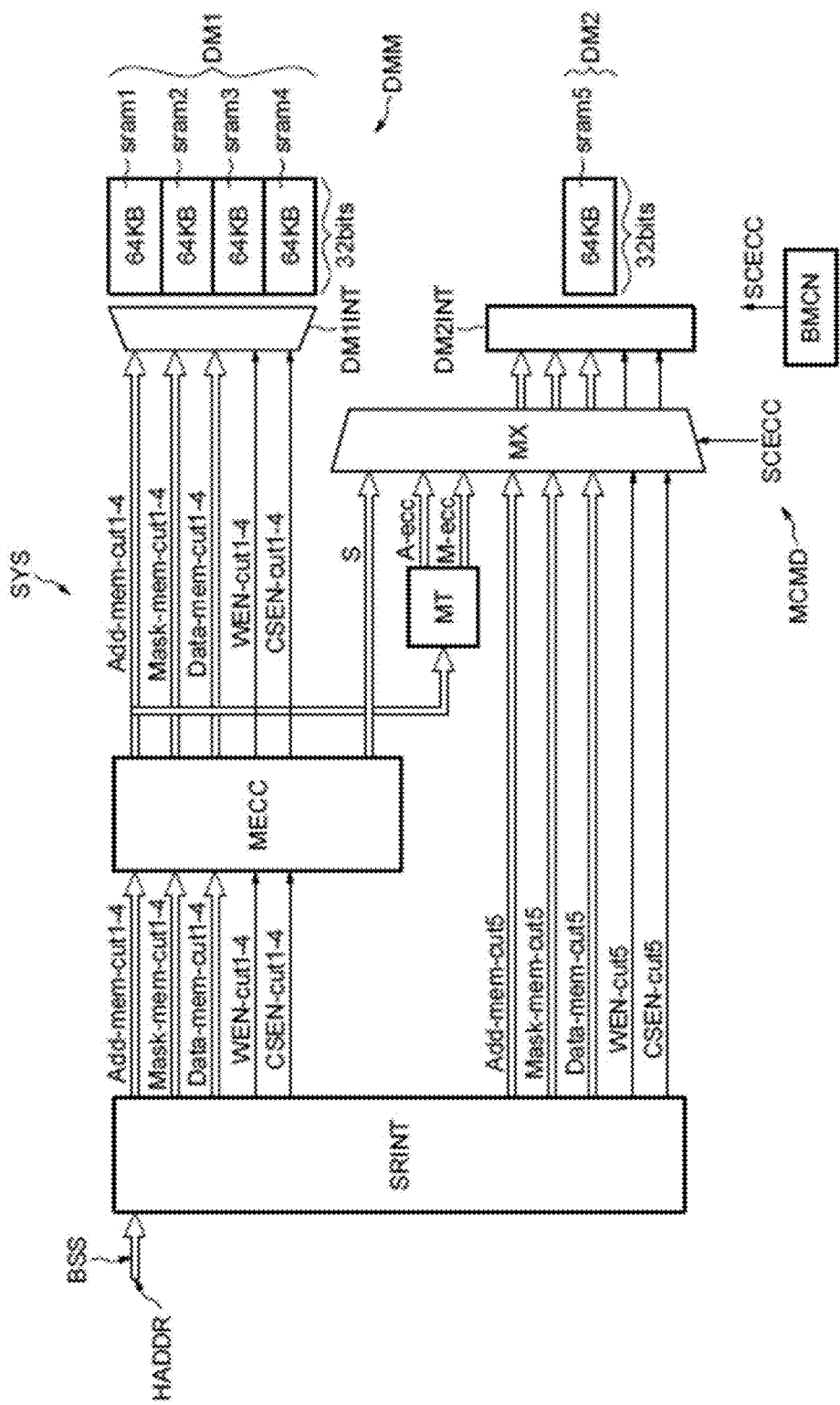
[Fig. 3]

| HADDR | bit | Add-mem-out | |
|---|---|---|---|
| 20000000 | ⇨ "00''0000'0000''0000'0000' | ⇨ 0000 | ⇦ start address sram1 |
| 2000FFFC | ⇨ "00''1111'1111''1111'1100' | ⇨ 3FFF | ⇦ end address sram1 |
| 20010000 | ⇨ "01''0000'0000''0000'0000' | ⇨ 4000 | ⇦ start address sram2 |
| 2001FFFC | ⇨ "01''1111'1111''1111'1100' | ⇨ 7FFF | ⇦ end address sram2 |
| 20020000 | ⇨ "10''0000'0000''0000'0000' | ⇨ 8000 | ⇦ start address sram3 |
| 2002FFFC | ⇨ "10''1111'1111''1111'1100' | ⇨ BFFF | ⇦ end address sram3 |
| 20030000 | ⇨ "11''0000'0000''0000'0000' | ⇨ C000 | ⇦ start address sram4 |
| 2003FFFC | ⇨ "11''1111'1111''1111'1100' | ⇨ FFFF | ⇦ end address sram4 |

| Si b1 b0 = '00' | ⇒ | M-ecc | = '00000000000000000000000000000001111111' | ⇒ | 1st byte selected for S |
| Si b1 b0 = '01' | ⇒ | M-ecc | = '00000000000000000000001111111100000000' | ⇒ | 2nd byte selected for S |
| Si b1 b0 = '10' | ⇒ | M-ecc | = '00000000111111110000000000000000000000' | ⇒ | 3rd byte selected for S |
| Si b1 b0 = '11' | ⇒ | M-ecc | = '11111111100000000000000000000000000000' | ⇒ | 4th byte selected for S |

[Fig. 6]

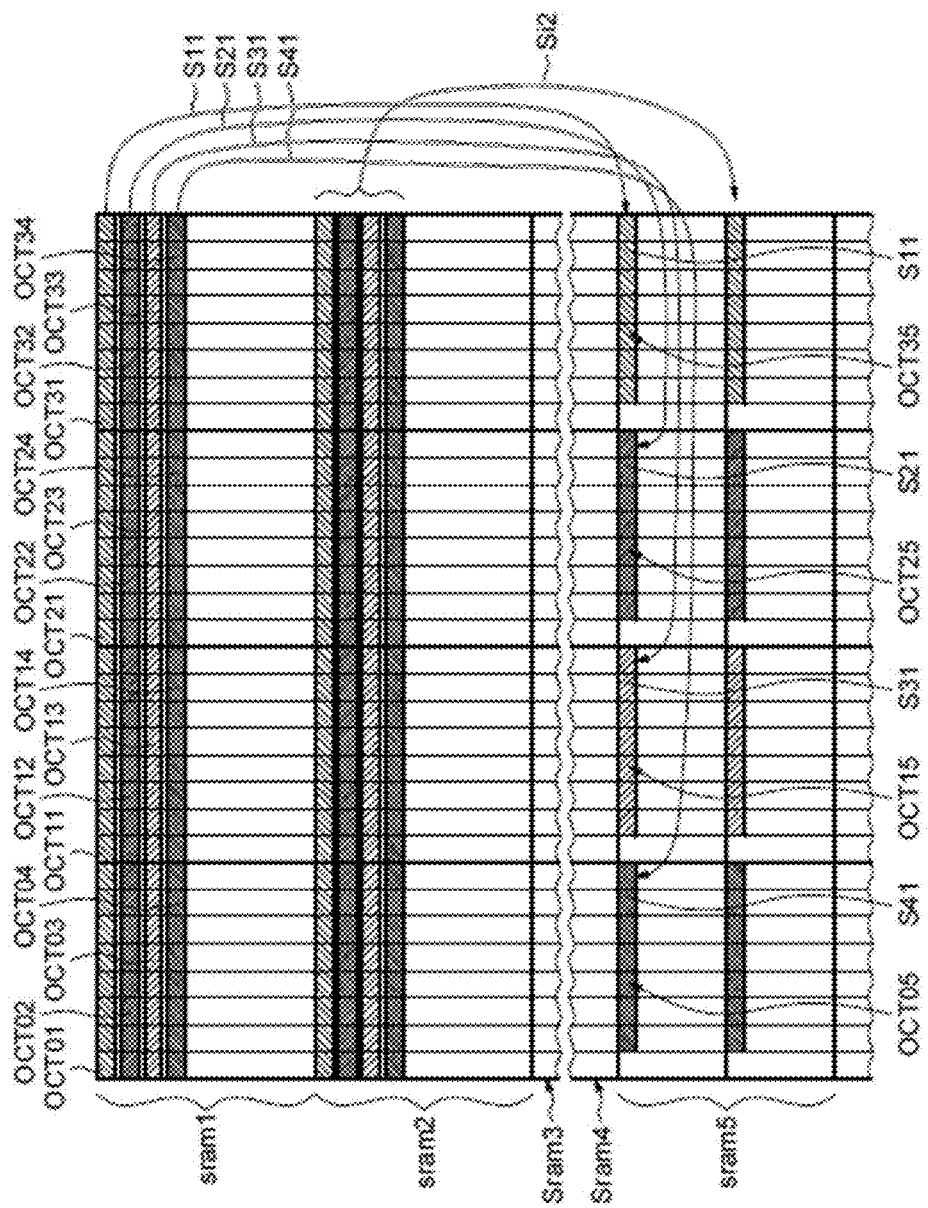
[Fig. 7]

METHOD FOR MANAGING THE MEMORY SPACE OF A MEMORY DEVICE AND CORRESPONDING SYSTEM

CROSS-REFERENCE TO RELATED APPLICATIONS

This application claims priority to French Patent Application No. 1872239, filed on Dec. 3, 2018, which application is hereby incorporated herein by reference.

TECHNICAL FIELD

The present invention relates generally to semiconductor memory, and, in particular embodiments, to method for managing the memory space of a memory device and corresponding system.

BACKGROUND

An error correction code is well known to those skilled in the art and makes it possible to correct the erroneous logic value of a bit. More precisely, with an error correction code, if s check bits are added to b data bits, it is possible to correct r errors among the b+s bits.

When it is desired to implement an error correction code, the size of the memory containing the data and the check bits is larger than the size of a memory intended to store data without use of an error correction code.

By way of indication, a static memory intended to store data on a width of 32 bits (32-bit words) has an additional width of 7 bits for storing check bits, thereby leading to an overall width of 39 bits, so as to be able to store 39-bit words.

The result of this is an area increase of 22% in comparison with a 32-bit memory that is not intended to store check bits.

If a user does not wish to use an error correction code in a particular application, this additional memory zone of 22% will never be used because it is not accessible for data storage. Now, this lost memory area has a direct impact in leakage currents, which is non-negligible for low-consumption products.

The addition of memory area also has an impact on the cost of the device.

There is therefore a need to rectify this drawback and to propose greater flexibility in the management of the memory space of a memory, so as to take into account the optional nature of the use of an error correction code.

SUMMARY

According to one embodiment, the system advantageously determines the third addresses on the basis of the first addresses.

This makes it possible to simplify the calculation of the third addresses and makes it possible to link the address of a check word associated with a data word with the address of this data word, so as to be able to very easily retrieve the check word in the second memory region.

According to one embodiment, the system comprises an interface.

This interface is configured so as to receive the first data and first initial addresses associated with these first data.

The interface is also configured so as to possibly receive the second data and second initial addresses associated with these second data.

The interface is also configured so as to deliver the first addresses on the basis of the first initial addresses and the second addresses on the basis of the second initial addresses.

Specifically, the first and second initial addresses are generally conveyed on a bus and, depending on the architecture of the system and on the size of the memory device, the first addresses and the second addresses in the memory device may be identical to or different from the first and second initial addresses.

Thus, for example, the first and second initial addresses may be coded on 17 bits, whereas the first and second addresses may be coded on 15 bits obtained for example by truncating two bits of the initial addresses.

The system also comprises an error correction code circuit configured so as to determine the check bits associated with said first data.

The system also comprises processing circuit configured so as to determine the third addresses of the check bits, and control circuit configured so as to deliver, to the second memory region, either the second data and said second addresses or the check bits and the third addresses.

According to one embodiment, the first memory region comprises at least one first memory zone having a first memory size, for example n kbits, with n being able to be equal to 32 or 64, without these values being limiting, and the second memory region contains a second memory zone also having said first size.

Said at least one first memory zone and the second memory zone contain rows.

Also, according to one embodiment, the processing circuit are configured so as to determine said third addresses, such that the check bits associated with the first data stored in a first number of successive rows of said at least one first memory zone are stored in a second number of rows of the second memory zone that is lower than the first number.

More particularly, when each row of said at least one first memory zone and each row of the second memory zone are configured so as to store words of p bytes, the processing circuit are configured so as to determine said third addresses, such that the check bits associated with the first data stored in p successive rows of said at least one first memory zone are stored in the p bytes of a row of the second memory zone.

Thus, if for example each row has the capacity to store 32-bit (4-byte) words, the check bits associated with the 32-bit data words stored in 4 successive rows of the first memory zone will be stored in the 4 bytes of a row of the second memory zone.

If for example each row has the capacity to store 64-bit (8-byte) words, the check bits associated with the 64-bit data words stored in 8 successive rows of the first memory zone will be stored in the 8 bytes of a row of the second memory zone.

In practice, the first memory region may contain a plurality of first memory zones, for example but without limitation 4 first memory zones, each having said first memory size, for example 64 kbits.

More particularly, if p, as indicated above, denotes the number of bytes able to be stored in a row, the first memory region may contain k.p first memory zones and the second memory region may contain k second memory zones, k being an integer greater than or equal to 1.

The memory device may be a volatile memory device, for example a static random access memory (SRAM), but also a non-volatile memory, for example an EEPROM memory, without these examples being limiting.

According to another aspect, what is proposed is a method for managing the memory space of a memory device containing a first memory region and a second memory region, the method comprising storing first data at first addresses in the first region and, on command, either storing, in the second memory region, second data at second addresses or storing, in the second memory region, error correction code check bits associated with the first data at third addresses.

According to one mode of implementation, the method comprises determining the third addresses on the basis of the first addresses.

Determining the third addresses advantageously includes truncating the first addresses.

According to one mode of implementation, the method comprises: receiving the first data and first initial addresses associated with the first data, and possibly receiving the second data and second initial addresses associated with these second data, formulating the first addresses on the basis of the first initial addresses and formulating the second addresses on the basis of the second initial addresses, determining the check bits associated with said first data, determining the third addresses of the check bits, and on command, delivering, to the second memory region, either said second data and said second addresses or the check bits and the third addresses.

According to one mode of implementation, the first memory region comprises at least one first memory zone having a first memory size and the second memory region contains a second memory zone also having said first memory size.

According to one mode of implementation, said at least one first memory zone and the second memory zone contain rows, and the check bits associated with the first data stored in a first number of successive rows of said at least one first memory zone are stored in a second number of rows of the second memory zone that is lower than the first number.

According to one mode of implementation, each row of said at least one first memory zone and each row of the second memory zone are configured so as to store words of p bytes, and the check bits associated with the first data stored in p successive rows of said at least one first memory zone are stored in the p bytes of a row of the second memory zone.

According to one mode of implementation, the first memory region contains a plurality of memory zones each having said first memory size.

According to one mode of implementation, the first memory region contains k.p first memory zones and the second memory region contains k second memory zones, k being an integer greater than or equal to 1.

The memory device may be a volatile memory device.

BRIEF DESCRIPTION OF THE DRAWINGS

Other advantages and features of the invention will become apparent upon examining the detailed description of completely nonlimiting embodiments and modes of implementation of the invention and the appended drawings, in which:

FIG. 1 illustrates one embodiment of a memory device according to the invention in a first configuration, FIG. 2 illustrates one embodiment of a memory device according to the invention in a second configuration, FIG. 3 illustrates one embodiment of a system according to the invention, FIG. 4 partially illustrates one mode of implementation of the method according to the invention, FIG. 5 partially illustrates one mode of implementation of the method according to the invention, FIG. 6 partially illustrates one mode of implementation of the method according to the invention, and FIG. 7 partially illustrates one exemplary implementation of the invention.

DETAILED DESCRIPTION OF ILLUSTRATIVE EMBODIMENTS

Modes of implementation and embodiments of the invention relate to the management of the memory space of a memory device, in particular a volatile memory device, for example a static random access memory (SRAM), in particular when the use of an error correction code (ECC) is optional.

According to one mode of implementation and embodiment, what is proposed is a memory capable of storing data and error correction code check bits and of possibly being able to reuse the memory space provided for these check bits, for the purpose of storing data if, in some applications, there is not provision to use an error correction code.

According to one aspect, what is proposed is a system comprising a memory device containing a first memory region intended to store first data at first addresses and a second memory region intended to store, on command, either second data at second addresses or error correction code check bits associated with the first data at third addresses.

In FIG. 1, the reference DMM denotes a memory device, in this case a volatile memory device, containing a first memory region DM1 and a second memory region DM2.

The first memory region DM1 contains four memory zones sram1, sram2, sram3 and sram4 of identical memory size.

In the example illustrated here, these memory zones are formed by separate static random access memories. That being said, it would also be able to be contemplated for these memory zones to be memory zones of one and the same memory.

The second memory region DM2 contains a memory zone sram5, of memory size identical to that of memory zones sram1-sram4.

In this case as well, the memory zone sram5 is a static random access memory.

In the example described here, the width of the memory device is equal to 32 bits, that is to say that it is possible to store 32-bit data words each containing four bytes.

The memory size is equal to n kbits, for example 64 kbits.

The memory zones sram1-sram4 are intended to respectively store data Data-mem-cut1-4.

In the configuration illustrated in FIG. 1, the memory zone sram5 is intended to contain the error correction code check bits associated with the data stored in the memory zones sram1-sram4.

This is performed upon the command of a signal SCECC that in this case adopts the logic value 1, for example.

FIG. 2 illustrates another configuration of the memory device DMM, in which the memory zone sram5 is this time intended to store second data Data-mem-cut5.

This corresponds to the case in which a user may not wish to use an error correction code, but may wish by contrast to use the space available in the memory zone sram5 to store data there.

In this case, the control signal SCECC is equal to 0.

Reference is now made more particularly to FIG. 3 in order to describe one embodiment of a system according to the invention.

The system SYS includes an interface SRINT connected to a bus BSS that may have any conventional structure and be for example an AHB bus using a protocol described for example in the document AMBA 3 AHB-Lite Protocol V1.0 Specification, from ARM (2001, 2006).

This bus conveys in particular the first data Data-mem-cut1-4, first initial addresses HADRR associated with the first data, possibly the second data Add-memory-cut5 and their second initial addresses HADRR, and other conventional bus signals, which are not shown here for the sake of simplicity.

The interface SRINT, having a structure that is conventional and known per se, is configured so as to deliver first addresses associated with the first data Data-mem-cut1-4 and so as possibly to deliver second addresses associated with the second data Data-mem-cut5.

These first and second addresses are respectively drawn from the first and second initial addresses HADRR that were conveyed on the bus BSS.

The first and second addresses could be identical to the first initial addresses. That being said, depending on the architecture of the system, and in particular on the width of the memory zones, the first and second addresses may be obtained on the basis of the first and second initial addresses by truncating one or more bits.

In the example described here, a 32-bit word formed of 4 bytes of 8 bits may be written to each row of a memory zone sram1, i equal to 1, 2, 3 or 4.

Thus, in this example, the references Add-mem-cut1-4 denote the addresses of a row of the memory zones sram1-4, and the reference Mask-mem-cut1-4 denotes the number of the byte in the denoted row of the memory zone under consideration.

The addresses Add-mem-cut1-4 and the masks Mask-mem-cut1-4 thus form said first addresses.

Likewise, the address Add-mem-cut5 and the mask Mask-mem-cut5 form the second address associated with a second item of data Data-mem-cut5.

The signals WEN-cut-1-4 and WEN-cut5 are conventional control signals for writing to the various memory zones, and the signals CSEN-cut1-4 and CSEN-cut5 are conventional signals for selecting the memory zone under consideration.

The system SYS also includes an error correction code circuit MECC, having a structure that is conventional and known per se, configured so as to determine the check bits associated with said first data Data-mem-cut1-4.

More precisely, for a four-byte word stored in a row of a memory zone sram1-4, the reference S denotes the s check bits associated with this 4-byte word.

In the case of a 32-bit word, S is a 7-bit word. As a result, S may be stored in one byte of the memory zone sram5.

If the width of the memory were to be 64 bits and not 32 bits, S would have a length of 8 bits, which could still be stored in one byte of the memory zone sram5.

As is conventional, to write a new 32-bit word to a row of one of the memory zones sram1 to sram4, the word that is already stored in this row is first of all read.

The error correction code circuit MECC then determines a syndrome on the basis of the data bits and of the set S of check bits.

It is recalled here that a syndrome is the result of intermediate calculations performed during error correction, making it possible to detect and to locate the error.

If a bit is defective, the MECC block effectively detects this defective bit and corrects it.

Before writing the new word to the address of the previous word in the corresponding memory zone, the MECC block calculates the new set S of new check bits corresponding to the new bytes of data. In this respect, the new set S of check bits is calculated with the corrected value of the defective bit, where applicable.

The new word is then written to the corresponding memory zone at the corresponding first address.

With regard to the new set S of check bits, this is delivered to an input of a multiplexer MX, as illustrated in FIG. 3.

The system SYS also includes processing circuit MT configured so as to determine third storage addresses for these check bits S.

These check bits S will specifically be stored in the memory zone sram5.

A third address in this case contains the address A-ecc of a row of the memory zone sram5 and a mask M-ecc for selecting one of the 4 bytes in said row.

As will be seen in more detail hereinafter, these third addresses are determined on the basis of the first addresses, and more precisely on the basis of the row addresses Add-mem-cut1-4.

The system SYS also includes control circuit MCMD configured so as to deliver, to the second memory region, that is to say in this case to the memory zone sram5, either the second data Data-mem-cut5 and the associated second addresses Add-mem-cut5, Mask-mem-cut5 or the check bits S and the third addresses A-ecc, M-ecc.

The control circuit MCMD in this case includes a module BMCM, for example a logic checking unit delivering the control signal SCECC, and the multiplexer MX receiving this control signal SCECC on its control input.

Of course, depending on the value of the signal SCECC, the signal WEN-cut5 and the signal CSEN-cut5 will also be delivered to the memory interface DM2INT coupled to the memory zone sram5.

By contrast, the signals WEN-cut1-4 and CSEN-cut1-4 are, for their part, delivered only to the interface SM1INT coupled to the first memory region DM1.

Figure 5:
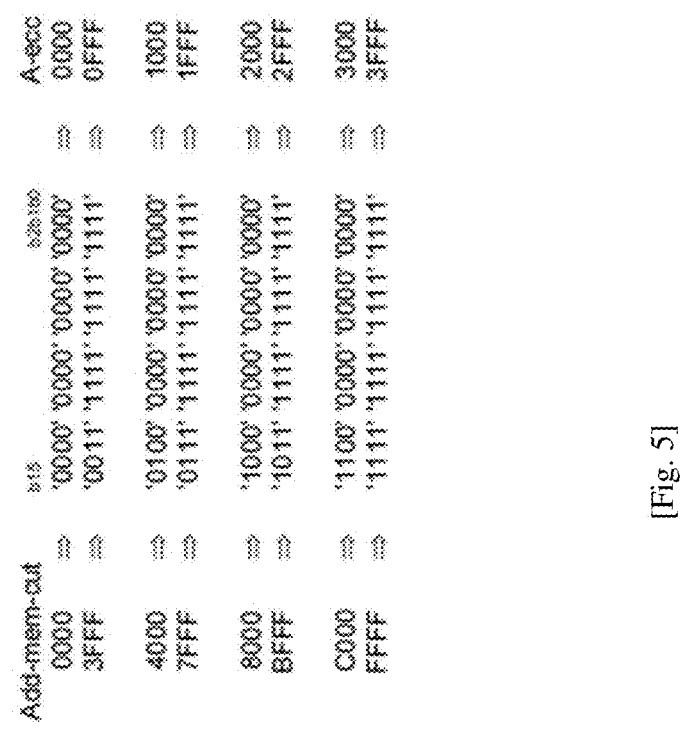

Reference is now made more particularly to FIGS. 4 to 7 in order to illustrate one mode of implementation of the method according to the invention.

FIG. 4 more particularly illustrates the obtaining of the first addresses associated with the first data intended to be stored in the memory zones sram1-sram4 on the basis of the first initial addresses HADRR received by the memory interface SRINT.

In the example described here, the initial addresses HADDR are addresses coded on 18 bits b0-b17.

The left-hand part of FIG. 4 illustrates these addresses in hexadecimal format.

The first addresses Add-mem-cut are obtained by truncating the two least significant bits b0, b1 of the initial addresses.

The right-hand part of FIG. 4 thus illustrates these addresses Add-mem-cut in hexadecimal format.

More precisely, the value 0000 is the start address of the zone sram1, whereas the address 3FFF is the end address of this memory zone sram1.

The address 4000 is the start address of the memory zone sram2, whereas the address 7FFF is the end address of this memory zone sram2.

The address 8000 is the start address of the memory zone sram3, whereas the address BFFF is the end address of this memory zone sram3.

Lastly, the address C000 is the start address of the memory zone sram4, whereas the address FFFF is the end address of this memory zone sram4.

Of course, the memory addresses Add-mem-cut5 associated with the data possibly intended to be stored in the memory zone sram5 are obtained in the same way as what has just been described.

FIG. 5 illustrates one example of obtaining the third addresses A-ecc on the basis of the first addresses Add-mem-cut.

More precisely, in this case as well, the addresses Add-mem-cut are truncated by two bits in order to obtain the address A-ecc of the corresponding row in the memory zone sram5.

More precisely, this truncation is a truncation of the two least significant bits b0-b1 of the address Add-mem-cut.

The check bits S associated with the data stored in the memory zone sram1 will thus be written between the addresses 0000 and 0FFF of the memory zone sram5.

The check bits associated with the data written to the memory zone sram2 will be stored between the addresses 1000 and 1FFF of the memory zone sram5.

The check bits associated with the data written to the memory zone sram3 will be stored between the addresses 2000 and 2FFF of the memory zone sram5.

Lastly, the check bits associated with the data written to the memory zone sram4 will be stored between the addresses 3000 and 3FFF of the memory zone sram5.

Lastly, as illustrated in FIG. 6, the mask M-ecc depends on the value of the two least significant bits b1, b0 of the address Add-mem-cut.

More precisely, if these two bits b1, b0 are equal to 0, then the first byte of M-ecc is equal to 1, the other bits being equal to 0, this meaning that the first byte of the corresponding row is selected to store the check bits S.

If the two bits b1, b0 have respective values of 0 and 1, then this time it is the second byte of the mask M-ecc that has the value 1, this meaning that the second byte of the row is selected to store the check bits S.

If the bits b1, b0 have respective values of 1 and 0, then this time it is the third byte of M-ecc that has the value 1, this corresponding to a selection of the third byte of the corresponding row to store the check bits S.

Lastly, if the two bits b1 and b0 both have the value 1, then it is the fourth byte of M-ecc that has the value 1, this corresponding to a selection of the fourth byte of the corresponding row to store the check bits.

Of course, this technique of determining M-ecc is also applicable to determining Mask-mem-cut5-4 and Mask-mem-cut5, so as to select, for each byte of a data word to be stored, the corresponding byte in the addressed row.

Thus, for example if it is desired to store a data byte at the initial address HADDR equal to 0x2001ABC8, the first address will be equal, after truncating the initial address, to 6AF2, this corresponding to a first address Add-mem-cut2 of a row of the second memory zone sram2.

With regard to the 7-bit word forming the word S of the check bits that is associated with the new 32-bit word stored in the row, the address A-ecc of the corresponding row in the memory zone sram5, after truncating the first address Add-mem-cut2, has the value 1ABC.

The mask M-ecc associated with this row address, since the two least significant bits b1, b0 of the first address have respective values of 1 and 0, indicates a selection of the third byte of this row to store this check word S.

Reference is now made more particularly to FIG. 7 in order to illustrate one exemplary implementation of the method according to the invention.

In this example, it is assumed that all of the memory zones sram1 to sram2 and sram5 have a memory size of 64 kbits with a word width of 32 bits.

As a result, each memory zone contains 2048 rows, each row being able to contain a 32-bit (4-byte) word.

The error correction code is applied. Each check word associated with a 32-bit data word contains 7 check bits.

By applying the abovementioned address and mask determination rules, it is seen that the set S11 of check bits associated with the four bytes OCT01, OCT11, OCT21 and OCT31 of the first row of the memory zone sram1 will be stored in the byte OCT35 of the first row of the memory zone sram5.

Likewise, the check bit word S21 associated with the four bytes OCT02, OCT12, OCT22 and OCT32 of the second row of the memory zone sram1 will be stored in the byte OCT25 of the first row of the memory zone sram5.

The check bit word S31 associated with the four bytes OCT03, OCT13, OCT23 and OCT33 of the third row of the memory zone sram1 will be stored in the byte OCT15 of the first row of the memory zone sram5.

Lastly, the check bit word S41 associated with the four bytes OCT04, OCT14, OCT24 and OCT34 of the fourth row of the memory zone sram1 will be stored in the byte OCT05 of the first row of the memory zone sram5.

Also, this process of storing the various check bit words associated with the various rows will continue.

Generally speaking, the four check bit words associated with the four words of four consecutive rows of a memory zone sram1, i varying between 1 and 4, will be stored in just one and the same row of the memory zone sram5.

Therefore, the check words associated with the 2048 rows of the memory zone sram1 will be stored in 512 rows of the memory zone sram5.

Also, the 512 following rows of the memory zone sram5 will be dedicated to storing the check bit words Si2 associated with the data stored in the memory zone sram2.

What is claimed is:

1. A system comprising:
 a memory device comprising
  a first memory region configured to store first data at first addresses, and
  a second memory region configured to store second data at second addresses when a signal command is set to a first value and configured to store error correction code check bits associated with the first data at third addresses when the signal command is set to a second value, the third addresses being truncated first addresses, and
 a processing circuit configured to determine the third addresses on the basis of the first addresses.

2. The system according to claim 1, furthermore comprising:
 an interface configured to
  receive the first data and first initial addresses associated with the first data, and the second data and second initial addresses associated with the second data, and
  deliver the first addresses and the second addresses on the basis of the first initial addresses and of the second initial addresses,
 an error correction code circuit configured to determine the error correction code check bits associated with the first data, and a control circuit configured to deliver, to the second memory region, either
the second data and the second addresses or
the error correction code check bits and the third addresses.

3. The system according to claim 1, wherein the first memory region comprises at least one first memory zone having a first memory size and the second memory region comprises a second memory zone also having the first memory size.

4. The system according to claim 3, wherein the at least one first memory zone and the second memory zone comprise rows, wherein the first data is stored in a first number of successive rows of the at least one first memory zone, and wherein the error correction code check bits associated with the first data are stored in a second number of rows of the second memory zone that is lower than the first number.

5. The system according to claim 4, wherein each row of the at least one first memory zone and each row of the second memory zone are configured to store words of p bytes, wherein the error correction code check bits associated with the first data stored in p successive rows of the at least one first memory zone are stored in the p bytes of a row of the second memory zone.

6. The system according to claim 5, wherein the first memory region contains k times p first memory zones and the second memory region comprises k second memory zones, k being an integer greater than or equal to 1.

7. The system according to claim 3, wherein the first memory region comprises a plurality of first memory zones each having the first memory size.

8. The system according to claim 1, wherein the memory device is a volatile memory device.

9. The system of claim 1, further comprising:
an error correction code circuit configured to determine the error correction code check bits associated with the first data, and
a control circuit configured to deliver, to the second memory region, either
the second data and the second addresses or
the error correction code check bits and the third addresses.

10. A memory device comprising:
a plurality of memory regions comprising a first memory region configured to store first data at first addresses and a second memory region;
an error correction code circuit configured to determine check bits associated with first data to be stored in the first memory region; and
a control circuit configured to
determine whether a signal command is set to a first value or to a second value different from the first value,
deliver a second data to be stored in the second memory region at second addresses in response to determining that the signal command is set to the first value, and
deliver the check bits to be stored in the second memory region at third addresses determined on the basis of the first addresses in response to determining that the signal command is set to the second value, the third addresses being truncated first addresses.

11. The memory device according to claim 10, wherein the first memory region comprises at least one first memory zone having a first memory size and the second memory region comprises a second memory zone also having the first memory size.

12. The memory device according to claim 11, further comprising a processing circuit configured to determine the third addresses for the check bits, wherein the at least one first memory zone and the second memory zone comprise rows, wherein the first data is stored in a first number of successive rows of the at least one first memory zone, and wherein the check bits associated with the first data are stored in a second number of rows of the second memory zone that is lower than the first number.

13. The memory device according to claim 12, wherein each row of the at least one first memory zone and each row of the second memory zone are configured to store words of p bytes, wherein the check bits associated with the first data stored in p successive rows of the at least one first memory zone are stored in the p bytes of a row of the second memory zone.

14. The memory device according to claim 13, wherein the first memory region contains k times p first memory zones and the second memory region comprises k second memory zones, k being an integer greater than or equal to 1.

15. A method for managing a memory space of a memory device, the method comprising:
storing first data at first addresses of a first memory region of the memory device;
in response to determining that a signal command is set to a first value, storing in a second memory region of the memory device, second data at second addresses;
in response to determining that the signal command is set to a second value different from the first value, storing error correction code check bits associated with the first data at third addresses in the second memory region; and
determining the third addresses on the basis of the first addresses, which includes truncating the first addresses.

16. The method according to claim 15, further comprising:
receiving the first data and first initial addresses associated with the first data, and receiving the second data and second initial addresses associated with the second data;
formulating the first addresses on the basis of the first initial addresses and formulating the second addresses on the basis of the second initial addresses;
determining the error correction code check bits associated with the first data;
determining the third addresses of the error correction code check bits; and
in response to determining that the signal command is set to the first value or the second value, delivering to the second memory region either the second data and the second addresses or the error correction code check bits and the third addresses.

17. The method according to claim 15, wherein the first memory region comprises at least one first memory zone having a first memory size and the second memory region comprises a second memory zone also having the first memory size.

18. The method according to claim 17, wherein the at least one first memory zone and the second memory zone comprise rows, wherein the first data are stored in a first number of successive rows of the at least one first memory zone and the error correction code check bits associated with the first data are stored in a second number of rows of the second memory zone that is lower than the first number.

19. The method according to claim 18, wherein each row of the at least one first memory zone and each row of the second memory zone are configured to store words of p bytes, and the error correction code check bits associated with the first data stored in p successive rows of the at least one first memory zone are stored in the p bytes of a row of the second memory zone.

20. The method according to claim 19, wherein the first memory region comprises k times p first memory zones and the second memory region comprises k second memory zones, k being an integer greater than or equal to 1.

21. The method according to claim 17, wherein the first memory region comprises a plurality of memory zones each having the first memory size.

22. The method according to claim 16, wherein the memory device is a volatile memory device.

* * * * *